(12) United States Patent
Berthod et al.

(10) Patent No.: US 10,461,129 B2
(45) Date of Patent: Oct. 29, 2019

(54) DEVICE FOR DETECTING ELECTROMAGNETIC RADIATION CONSISTING OF ORGANIC MATERIALS

(71) Applicant: ISORG, Grenoble (FR)

(72) Inventors: Emeline Berthod, Grenoble (FR); Olivier Dhez, Grenoble (FR); Jean-Yves Gomez, Grenoble (FR)

(73) Assignee: ISORG, Grenoble (FR)

( * ) Notice: Subject to any disclaimer, the term of this patent is extended or adjusted under 35 U.S.C. 154(b) by 253 days.

(21) Appl. No.: 15/502,428

(22) PCT Filed: Aug. 18, 2015

(86) PCT No.: PCT/FR2015/052222
§ 371 (c)(1),
(2) Date: Jul. 11, 2017

(87) PCT Pub. No.: WO2016/027033
PCT Pub. Date: Feb. 25, 2016

(65) Prior Publication Data
US 2017/0345872 A1 Nov. 30, 2017

(30) Foreign Application Priority Data
Aug. 19, 2014 (FR) .................... 14 57870

(51) Int. Cl.
*G06F 3/042* (2006.01)
*H01L 27/30* (2006.01)
(Continued)

(52) U.S. Cl.
CPC .......... *H01L 27/305* (2013.01); *G06F 3/0416* (2013.01); *G06F 3/0421* (2013.01);
(Continued)

(58) Field of Classification Search
CPC .......... H01L 51/4206; H01L 27/14601; G06F 3/0416; G06F 3/042; G06F 3/0421; Y02E 10/549; Y02P 70/521
(Continued)

(56) References Cited

U.S. PATENT DOCUMENTS 6,483,099 B1 11/2002 Yu et al.
7,276,727 B2 * 10/2007 Stasiak ............... H01L 51/0059
257/40
(Continued)

FOREIGN PATENT DOCUMENTS

| GB | 1106079 A | 3/1968 |
|---|---|---|
| WO | 9909603 A1 | 2/1999 |
| WO | 2013045779 A1 | 4/2013 |

OTHER PUBLICATIONS

Authorized Officer: Fratiloiu, Silvia, "International Search Report" issued in counterpart PCT application No. PCT/FR2015/052222, dated Nov. 12, 2015, Publisher: PCT.
(Continued)

*Primary Examiner* — Que Tan Le
(74) *Attorney, Agent, or Firm* — Kaplan Breyer Schwarz, LLP

(57) ABSTRACT

A device for detecting electromagnetic radiation includes at least one row of photoresistors. Each of the photoresistors includes an active portion containing organic semiconductor materials.

9 Claims, 3 Drawing Sheets

(51) Int. Cl.
*H01L 51/42* (2006.01)
*G06F 3/041* (2006.01)

(52) U.S. Cl.
CPC .................. *H01L 51/4206* (2013.01); *G06F 2203/04108* (2013.01); *G06F 2203/04109* (2013.01); *Y02E 10/549* (2013.01); *Y02P 70/521* (2015.11)

(58) Field of Classification Search
USPC ........................................ 250/227.11, 214.1
See application file for complete search history.

(56) References Cited

U.S. PATENT DOCUMENTS

| | | | |
|---|---|---|---|
| 8,354,666 | B2 | 1/2013 | Lee et al. |
| 9,417,731 | B2* | 8/2016 | Gomez .................. G06F 3/042 |
| 2003/0141498 | A1 | 7/2003 | Stasiak |
| 2006/0145365 | A1 | 7/2006 | Halls et al. |
| 2007/0287394 | A1 | 12/2007 | Swan et al. |
| 2008/0122798 | A1 | 5/2008 | Koshiyama et al. |
| 2008/0150848 | A1 | 6/2008 | Chung et al. |
| 2008/0297487 | A1 | 12/2008 | Hotelling et al. |
| 2009/0027371 | A1 | 1/2009 | Lin et al. |
| 2009/0123029 | A1 | 5/2009 | Harada et al. |
| 2009/0237372 | A1 | 9/2009 | Kim et al. |
| 2010/0067235 | A1 | 3/2010 | Yamashita et al. |
| 2010/0103139 | A1 | 4/2010 | Soo et al. |
| 2010/0283763 | A1 | 11/2010 | Kim et al. |
| 2010/0294936 | A1 | 11/2010 | Boeberl et al. |
| 2010/0295821 | A1 | 11/2010 | Chang et al. |
| 2010/0315413 | A1 | 12/2010 | Izadi et al. |
| 2011/0175830 | A1 | 7/2011 | Miyazawa et al. |
| 2011/0316679 | A1 | 12/2011 | Pihlaja |
| 2013/0076695 | A1 | 3/2013 | Gomez et al. |

OTHER PUBLICATIONS

Stéphanie Zangl et al., "Adaptation to Scientific and Technical Progress under Directive 2002/95/EC—Evaluation of New Requests for Exemptions and/or Review of Existing Exemptions", dated May 30, 2011, Publisher: Oko-Institut e.V.—Institute for Applied Ecology, XP055187796, http://rohs.exemptions.oeko.info/fileadmin/user_upload/roHS_IV/roHS_final_report_May_2011_final.pdf, Country of Publication: DE.

Guifang Dong et al., "Organic photocouplers consisting of organic light-emitting diodes and organic photoresistors", dated Feb. 1, 2006, "Applied Physics Letters 88", DOI: 10.1063/1.2171480., Publisher: American Institute of Physics, Country of Publication: US.

English Translation of the "Written Opinion of the International Searching Authority" issued in counterpart PCT application No. PCT/FR2015/052222, dated Feb. 1, 2017.

V. Charcos Llorens, French Application No. 11/58611 Search Report, Apr. 27, 2012, Publisher: inpi, Published in: FR.

Related U.S. Appl. No. 14/347,982, Patent Application (Specification and Claims), Published in: US.

Related U.S. Appl. No. 13/569,379, Patent Application (Specification & Claims), Published in: US.

Related U.S. Appl. No. 13/569,379, NonFinal Office Action, dated Feb. 27, 2014, Publisher: USPTO, Published in: US.

Pascal Coutance, "L'avenir appartient a l'electronique imprimee (XP002674911)", "Ce document decrit des caracteristiques du produit appele Magic Pad", Jan. 2, 2012, Publisher: http://www.isorg.fr/fr/rep-edito/ido-99/l.sub.--avenir.sub.--appartient.s-ub.-b.sub.-l.sub.--b.sub.-lectronique.sub.--imprimb.sub.-e.html, Published in: FR.

Olivier Pentier, "Isorg rend les surfaces intelligentes (XP002674900)", "Le Dauphine Libere", Sep. 6, 2011, pp. 5-5, Publisher: URL:http://www.isorg.fr/edito/files/isorg.sub.-rend.sub.--les.sub.--surf-aces.sub.-intelligentes.sub.--379449.pdf, Published in: FR.

Officer: V. Charcos Llorens, International Patent Application No. PCT/FR2012/051863, International Search Report, dated Nov. 26, 2012, Publisher: PCT, Published in: FR.

Non-Final Office Action, dated Apr. 3, 2015, issued in related U.S. Appl. No. 13/569,379.

Non-Final Office Action dated Oct. 21, 2015, issued in co-pending U.S. Appl. No. 14/347,982.

Marie Freebody, "New Materials Build Better Organic Photodetectors (XP002674974)", Aug. 9, 2011, pp. 1-3, Publisher: URL:http://www.isorg.fr/edito/files/new.sub.-materials.sub.-build.sub.---better.sub.--organic.sub.--photodetectors.sub.--174887.pdf, Published in: FR.

Linh Nguyen Hoffner, Advisory Action, dated Dec. 24, 2014 issued in related U.S. Appl. No. 13/569,379.

Laurent Marchandiau, "Isorg parie sur l'electronique organique imprimee, (XP002674975)", "Interview-Eco; L'essor", Sep. 12, 2011, Publisher: URL:http://www.lessor.fr/2011/09/12/interview-eco-isorg-parie-sur-1%E2%80-%99electronique-organique-imprimee/, Published in: FR.

Laurent Jamet, Isorg, "The Next Big Wave in the Electronics Industry (XP002674899)", "Onboard Technology", Sep. 14, 2011, pp. 32-34, Publisher: Internet: URL:http://www.isorg.fr/edito/files/the.sub.--nextsub.--big.sub.—wave.s-ub.-in.sub.-the.sub.-electronics.sub.--industry.sub.--579453.pdf, Published in: FR.

Laurent Jamet, Isorg, "Organic Photodetectors and Image Sensors, Highly Innovative Products for New Markets and Attractive Business Opportunities for the Printed Electronics Industry (XP0108151359)", "Printed Electronics and Photovoltaics, Europe IDTECHEX, UK", Apr. 6, 2011, pp. 1-17, Publisher: www.idtechex.com.events/presentations/organic-photodetectors-and-image-se-nsors-highly-innovative-products-for-new-markets-and-attractive-business-, Published in: UK.

Jean-Yves Laurent et al, "CEA-Liten S2S printing platform for Organic CMOS and Sensors Devices", "Proceedings LOPE-C Conference 2011", Jun. 2011, Publisher: CEA-Liten Institute, Published in: Frankfurt.

"Final Office Action" issued in related U.S. Appl. No. 13/569,379 dated Sep. 30, 2015.

"Office Action" issued in related U.S. Appl. No. 13/569,379 dated Sep. 10, 2014.

Christophe Premont, "Photo detectors and sensors designed to be flexible (XP002674972)", "Electronic Engineering Times Europe", Sep. 14, 2011, pp. 17-18, Publisher: URL:http://www.isorg.fr/edito/files/photodectors.sub.--and.sub.-sensors-.sub.-designed.sub.-to.sub.--be.sub.-flexible.sub.-798566.pdf, Published in: FR.

Authorized Officer: V. Charcos Llorens, "International Search Report" issued in Related International Patent Application No. PCT/FR2012/051864 dated Nov. 26, 2012.

AEPI, "Agence d'Etude et de Promotion de l'Isere: 'ISORG a presente lors du Forum 41 une tablette interactive' (XP002674961)", "AEPI", Jun. 19, 2011, Publisher. URL: http://www.isorg.fr/rep-edito/ido-61/isorg.sub.-a.sub.-prb.sub.-sentb.sub.---lors.sub.-du.sub.-forum.sub.-4i.sub.-une.sub.-tablette.sub.-in-teractive.htm, Published in: FR.

\* cited by examiner

DEVICE FOR DETECTING ELECTROMAGNETIC RADIATION CONSISTING OF ORGANIC MATERIALS

The present patent application claims the priority benefit of French patent application FR14/57870 which will be incorporated herein by reference.

BACKGROUND

The present application relates to a device and a method for detecting an electromagnetic radiation, particularly light.

DISCUSSION OF THE RELATED ART

It has already been provided to form devices for detecting an electromagnetic radiation, particularly light, comprising electronic components of transistor, light-emitting diode, and photodetector type, based on organic conductor and semiconductor materials. Such materials have the advantage of being easier to deposit and more resistant than inorganic conductor and semiconductor materials, for example, silicon, used in conventional technological processes.

The use of organic materials advantageously enables to form the detection device on any types of support and in particular on flexible supports such as plastic, paper, cardboard, or fabric, on supports of large dimensions, for example, signboards, or on disposable supports such as convenience good packages.

Patent application WO 2013/045779 describes an example of a user interface system comprising a display screen and an actuation member detection device comprising an array of photodiodes made of organic materials. Each photodiode is associated with a transistor. The transistors enable to select the photodiodes during the control of the detection device.

FIG. 1 is a partial simplified top view of an example of a light detection device 10 comprising an array of photodiodes 12 distributed in three rows 14 and three columns 15. A selection element 16 is associated with each photodiode 12. Each photodiode 12 may be made of organic conductor and semiconductor materials. Selection element 16 may correspond to an organic thin-film transistor (OTFT). One of the terminals among the source and the drain of transistor 16 is connected to an electrode of photodiode 12 and the other terminal among the source and the drain is connected to a conductive track 18. Conductive track 18 may be connected to all the selection elements 16 of a same row 14. Track 18 may be made of an opaque material, for example, of metal. The gate of each transistor 16 may be controlled by a signal transmitted by a track 20 of a transparent conductor material extending along a direction perpendicular to rows 14. Track 20 may be connected to all the transistors 12 of a same column 15. In FIG. 1, each transistor 16 is shown next to the associated photodiode 12. As a variation, each transistor 16 may be formed above the associated photodiode 12.

The surface of a photodetector intended, in operation, to be exposed to the electromagnetic radiation to be detected is called useful surface area of the detector. A disadvantage of device 10 is that the presence of transistors 16 causes a decrease in the useful surface area of photodiodes 12. Another disadvantage is that the method of manufacturing the detection device comprises a significant number of steps, particularly the photodiode manufacturing steps and the transistor manufacturing steps.

SUMMARY

An object of an embodiment is to overcome all or part of the disadvantages of previously-described electromagnetic radiation detection devices.

Another object of an embodiment is to increase the useful surface area of the detection device intended to receive the electromagnetic radiation.

Another object of an embodiment is to decrease the number of steps of the detection device manufacturing method.

Thus, an embodiment provides an electromagnetic radiation detection device comprising at least one row of photoresistors, each photoresistor comprising an active portion comprising organic semiconductor materials.

According to an embodiment, the detection device comprises an array of photoresistors distributed in rows and in columns.

According to an embodiment, each active portion is connected to a first conductive electrode and to a second conductive electrode.

According to an embodiment, the work function of the first conductive electrodes is equal to the work function of the second conductive electrodes to within 5%.

According to an embodiment, the detection device comprises a monolithic layer containing the active portions and extending between first conductive tracks corresponding to the first electrodes and second conductive tracks corresponding to the second electrodes.

According to an embodiment, the detection device further comprises display pixels.

According to an embodiment, the detection device further comprises electromagnetic radiation emitters.

According to an embodiment, the detection device further comprises a waveguide.

According to an embodiment, the waveguide comprises at least one surface intended to be in contact with at least one object, the photoresistors being distributed along an edge of said surface.

An embodiment also provides a detection system comprising the previously-defined detection device, a circuit for selecting one of the photoresistors, and a circuit for measuring the current flowing through the selected photoresistor or a voltage representative of the voltage across the selected photoresistor.

An embodiment also provides a method of controlling the previously-defined electromagnetic radiation detection device, comprising selecting a photoresistor from said at least one row and determining a signal representative of the resistance of the photoresistor.

According to an embodiment, the detection device comprises an array of photoresistors distributed in rows and in columns, first conductive tracks, and second conductive tracks, each first conductive track being connected to the photo-resistors of a same row and each second conductive track being connected to the photoresistors of a same column. The selection step comprises the steps of:

connecting the first conductive track connected to the photoresistor to be selected to a source of a first potential;

connecting the other first conductive tracks to a source of a second potential different from the first potential;

connecting the second conductive track connected to the photoresistor to be selected to the source of the second potential; and connecting the other second conductive tracks to the source of the first potential.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION

Figure 1:
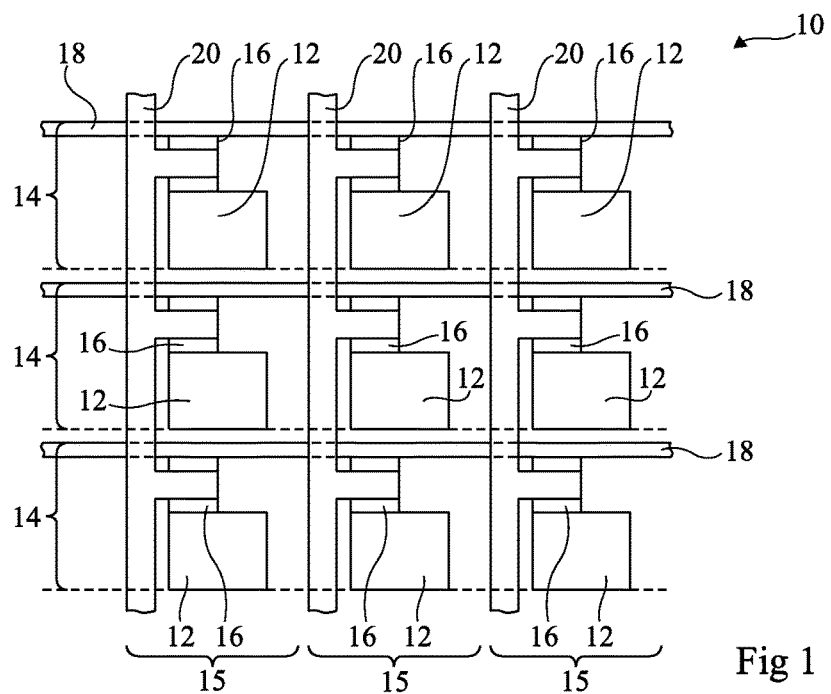
FIG. 1, previously described, is a partial simplified top view of an example of a radiation detection device comprising an array of photodiodes.

For clarity, the same elements have been designated with the same reference numerals in the various drawings and, further, the various drawings are not to scale. Further, only those elements which are useful to the understanding of the described embodiments have been shown and will be described. In particular, the means for processing the signals supplied by the detection devices described hereafter are within the abilities of those skilled in the art and are not described. In the following description, unless otherwise indicated, terms "substantially", "approximately", and "in the order of" mean "to within 10%".

An embodiment provides a device for detecting an electromagnetic radiation, particularly in a wavelength range between 400 nm and 1,000 nm, comprising an array of photo-detectors made of organic materials, where each photodetector comprises a photoresistor. The array comprises at least one row of a plurality of photoresistors. Each photoresistor comprises an active portion, comprising one or a plurality of organic semiconductor materials, sandwiched between two conductive electrodes. The detection device does not comprise one selection transistor for each photodetector. The useful surface area of each photodetector can be increased with respect to the case of a detection device comprising an array of organic photodiodes and of selection transistors. In particular, the photodetectors can be contiguous and the useful surface area of the photo-detector can extend over the entire detection device. Further, the structure of the detection device is simpler than that of a detection device comprising an array of organic photodiodes, each photodiode being associated with a selection transistor. The detection device manufacturing method is simplified. Indeed, it only comprises the steps of manufacturing the photoresistor array.

Figure 2:
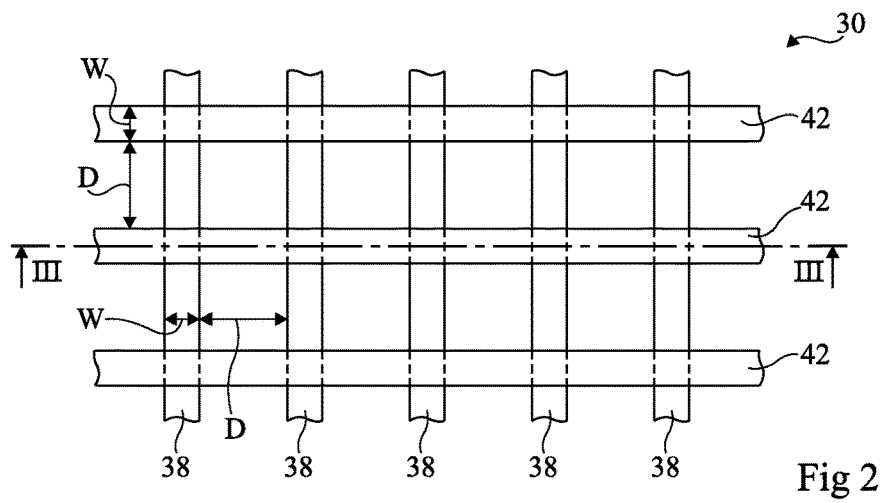
FIG. 2 is a partial simplified top view of an embodiment of radiation detection device.
Figure 3:
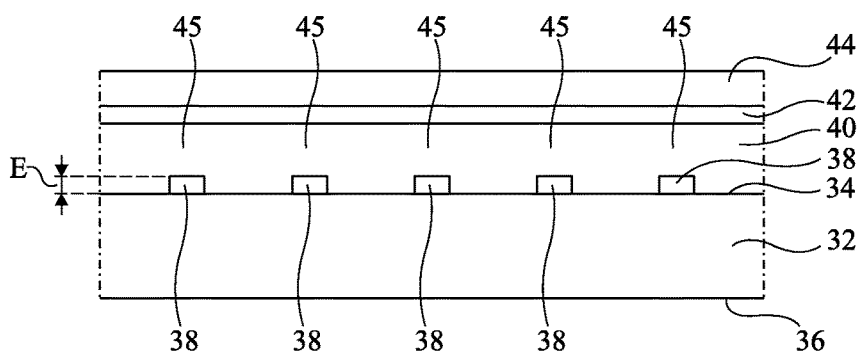
FIG. 3 is a partial simplified cross-section view of FIG. 2 along line III-III.

FIGS. 2 and 3 show an embodiment of a device 30 for detecting an electromagnetic radiation, particularly light.

Device 30 successively comprises, from bottom to top in FIG. 3:

a support 32 comprising two opposite surfaces 34, 36;

first electrodes 38, corresponding to conductive tracks 38 extending across surface 34 of substrate 32, for example, substantially parallel to a first direction;

an active layer 40 covering conductive tracks 38 and the exposed portions of substrate 32 between conductive tracks 38;

second electrodes 42, corresponding to conductive tracks 42 extending on active layer 40, for example substantially parallel to a second direction inclined with respect to the first direction, preferably substantially perpendicular to the first direction; and a protection layer 44 covering conductive tracks 42 and the exposed portions of layer 40 between conductive tracks 42.

Support 32 may be made of a dielectric material. Support 32 is for example a rigid support, particularly made of glass, or a flexible support, for example, made of polymer or of a metallic material. Examples of polymer are polyethylene naphthalene (PEN), polyethylene terephthalate (PET), kapton, and polyetheretherketone (PEEK). The thickness of support 32 is for example in the range from 20 µm to 1 cm, for example, approximately 125 µm. Support 32 may be made of a transparent or translucent material, for example, of glass or of plastic, particularly in the case where device 30 is intended to receive an illumination on the side of surface 36.

Conductive tracks 38 or 42 may be made of a conductive and transparent material, for example, of transparent conductive oxide or TCO, of carbon nanotubes, of graphene, of a conductive polymer, of a metal, or of a mixture or an alloy of at least two of these compounds. Conductive tracks 38 or 42 may have a multilayer structure.

Examples of TCO capable of forming conductive tracks 38 or 42 are indium tin oxide (ITO), aluminum zinc oxide (AZO), and gallium zinc oxide (GZO). Examples of conductive polymers capable of forming conductive tracks 38 or 42 are the polymer known as PEDOT:PSS, which is a mixture of poly(3,4)-ethylenedioxythiophene and of sodium poly(styrene sulfonate), and polyaniline, also called PAni. Examples of metals capable of forming conductive tracks 38 or 42 are silver (Ag), aluminum (Al), gold (Au), copper (Cu), nickel (Ni), titanium (Ti), and chromium (Cr). An example of a multilayer structure capable of forming electrodes is a multilayer AZO and silver structure of AZO/Ag/AZO type.

Thickness E of conductive tracks 38 or 42 may be in the range from 10 nm to 5 µm, for example, in the order of 30 nm. These layers may be deposited by a vacuum deposition method, particularly by evaporation or sputtering, by a liquid deposition method, particularly a sol-gel method, a method using dispersions or nanoparticles, or by any other type of deposition method. In the case where conductive tracks 38 and/or conductive tracks 42 are metallic and should be at least partially transparent, the thickness of conductive tracks 38 and/or 42 is smaller than or equal to 20 nm, preferably smaller than or equal to 10 nm. According to an embodiment, width W of each track 38 or 42 may be in the range from 5 µm to 150 µm, preferably from 7 µm to 100 µm, for example, approximately 20 µm. Interval D between two adjacent tracks 38 or between two adjacent tracks 42 may be in the range from 15 µm to 100 µm, preferably from 20 µm to 50 µm, for example, approximately 25 µm.

According to an embodiment, the work function of the material of conductive tracks 38 is equal to the work function of the material of conductive tracks 42 to within 5%. Preferably, conductive tracks 38, 42 are made of the same material or of the same materials.

The electric resistivity of active layer 40 may vary locally. It locally depends on the intensity of the electromagnetic radiation received by active layer 40 in the wavelength range between 400 nm and 1,000 nm, preferably between 480 nm and 680 nm.

Active layer 40 may comprise small molecules, oligomers, or polymers. These may be organic or inorganic materials. Active layer 40 may comprise an ambipolar semiconductor material, or a mixture of an N-type semiconductor material and of a P-type semiconductor material, for example in the form of stacked layers or of an intimate mixture at a nanometer scale to form a bulk heterojunction. The thickness of active layer 40 may be in the range from 50 nm to 500 nm, for example, in the order of 200 nm.

Example of P-type semiconductor polymers capable of forming active layer 40 are poly(3-hexylthiophene) (P3HT), poly[N-9'-heptadecanyl-2,7-carbazole-alt-5,5-(4,7-di-2-thienyl-2',1',3'-benzothiadiazole] (PCDTBT), poly[(4,8-bis-(2-ethylhexyloxy)-benzo[1,2-b;4,5-b']dithiophene)-2,6-diyl-alt-(4-(2-ethylhexanoyl)-thie-no[3,4-b]thiophene))-2,6-diyl];4,5-b']dithi-ophene)-2,6-diyl-alt-(5,5'-bis(2-thienyl)-4,4,-dinonyl-2,2'-bithiazole)-5',5'''-diyl] (PBDTTT-C), le poly [2-methoxy-5-(2-ethyl-hexyloxy)-1,4-phenylene-vinylene] (MEH-PPV) or poly[2,6-(4,4-bis-(2-ethylhexyl)-4H-cyclopenta [2,1-b;3,4-b']dithiophene)-alt-4,7(2,1,3-benzothiadiazole)] (PCPDTBT).

Examples of N-type semiconductor materials capable of forming active layer 40 are fullerenes, particularly C60, [6,6]-phenyl-$C_{61}$-methyl butanoate ([60]PCBM), [6,6]-phenyl-$C_{71}$-methyl butanoate ([70]PCBM), perylene diimide, zinc oxide (ZnO), or nanocrystals enabling to form quantum dots.

Protection layer 44 may be made of a dielectric material, for example, a resin. Protection layer 44 may have a thickness in the range from 1 µm to 100 µm, for example, approximately 50 µm. In the case where support 32 is made of a transparent material, protection layer 44 may be identical to support 32. Protection layer 44 may have a monolayer structure or a multilayer structure.

In the case where device 30 is intended to receive an illumination on the side of surface 36, support 32 and conductive tracks 38 are made of at least partly transparent materials. In the case where device 30 is intended to receive an illumination on the side of protection layer 44, protection layer 44 and conductive tracks 42 are made of at least partly transparent materials. In the case where device 30 is intended to receive an illumination indifferently on the side of surface 36 or on the side of protection layer 44, support 32, conductive tracks 38 and 42, and protection layer 44 are made of at least partly transparent materials.

Detection device 30 comprises an array of photoresistors 45. Each photoresistor 45 associated with a conductive track 38 and with a conductive track 42 corresponds to the portion of active layer 40 which will conduct a current when a voltage is applied between conductive tracks 38 and 42. This portion extends between conductive track 38 and conductive track 42 at the location where conductive track 38 and conductive track 42 overlap and may laterally extend on either side of conductive tracks 38, 42.

Figure 4A:
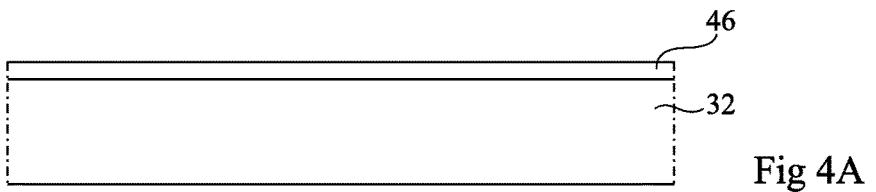
FIGS. 4A to 4D are partial simplified cross-section views of the structures obtained at successive steps of an embodiment of a method of manufacturing the radiation detection device of FIG. 2.
Figure 4B:
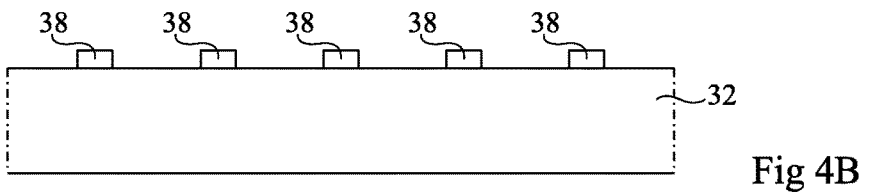
Figure 4C:
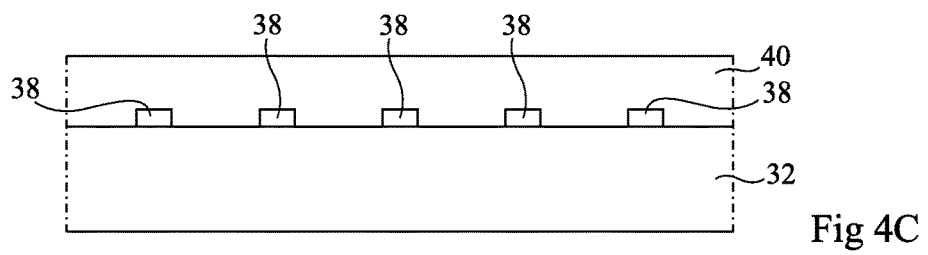
Figure 4D:
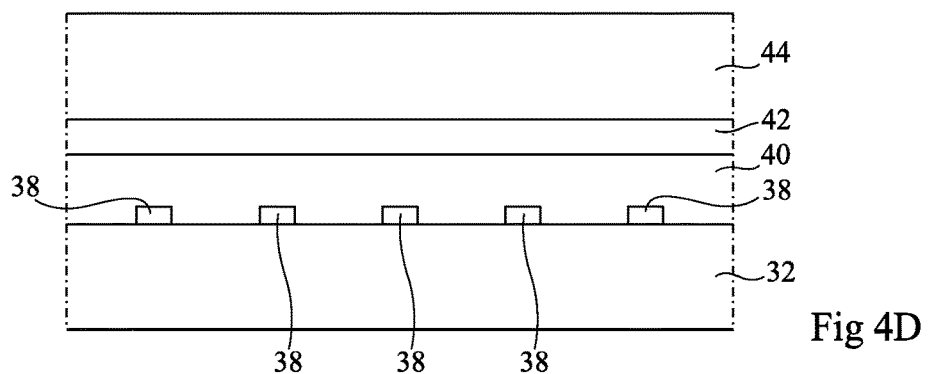

FIGS. 4A to 4D illustrate an embodiment of a method of manufacturing device 30 comprising the steps of:

forming conductive tracks 38 on support 32. According to the material used, the method of forming conductive tracks 38 may correspond to a so-called additive method, for example by direct deposition of the material forming conductive tracks 38 at the desired locations. This material is obtained, in particular, according to a sol-gel method. The deposition may be carried out by inkjet printing, photogravure, silk-screening, flexography, spray coating, or drop casting. The method of forming conductive tracks 38 may correspond to a so-called subtractive process, where a layer 46 of the material forming conductive tracks 38 is deposited all over the structure (FIG. 4A) and where the non-used portions are then removed, for example, by photolithography or laser ablation (FIG. 4B). According to the considered material, the deposition over the entire structure may be performed, for example, by liquid deposition, by cathode sputtering, or by evaporation. Methods such as spin coating, spray coating, heliography, slot-die coating, blade coating, flexography, or silk-screening, may in particular be used. When conductive tracks 38 are metallic, the metal is for example deposited by evaporation or by cathode sputtering over the entire support 32 and conductive tracks 38 are delimited by etching.

forming active layer 40 (FIG. 4C). Active layer 40 may be formed, according to the materials used, according to all or part of the methods previously described for the forming of conductive tracks 38;

forming conductive tracks 42 on another additional support 44 similarly to the forming of conductive tracks 38 on support 32; and attaching the conductive track 42/support 44 assembly to active layer 44, for example, by using a conductive bonding material (FIG. 4D).

According to another embodiment of the method of manufacturing detection device 30, after the step of forming active layer 40, the method comprises the steps of:

forming conductive tracks 42 on active layer 40; and forming protection layer 44 on conductive tracks 42 and on the portions of active layer 40 between conductive tracks 42.

Advantageously, detection device 30 may be formed by printing techniques. The materials of previously-described layers 38, 40, 42 may be deposited in liquid form, for example, in the form of conductor and semiconductor inks by means of inkjet printers. "Materials in liquid form" here also designates gel materials capable of being deposited by printing techniques. Anneal steps may be provided between the depositions of the different layers, but the anneal temperatures may not exceed 150° C., and the deposition and the possible anneals may be carried out at the atmospheric pressure.

Figure 5:
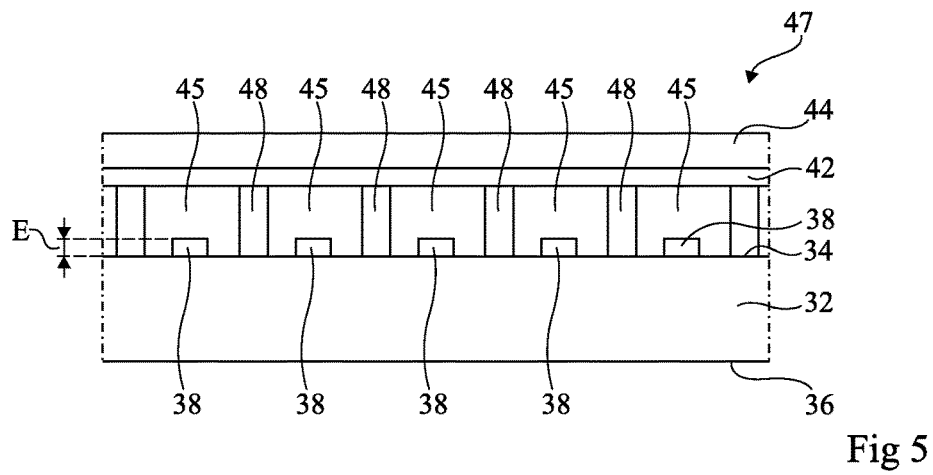
FIG. 5 is a cross-section view of another embodiment of radiation detection device.

FIG. 5 shows another embodiment of a detection device 47 comprising the same elements as detection device 30, with the difference that each photoresistor 45 corresponds to a different active portion. Active portions 45 are separated from one another by insulating portions 48.

Figure 6:
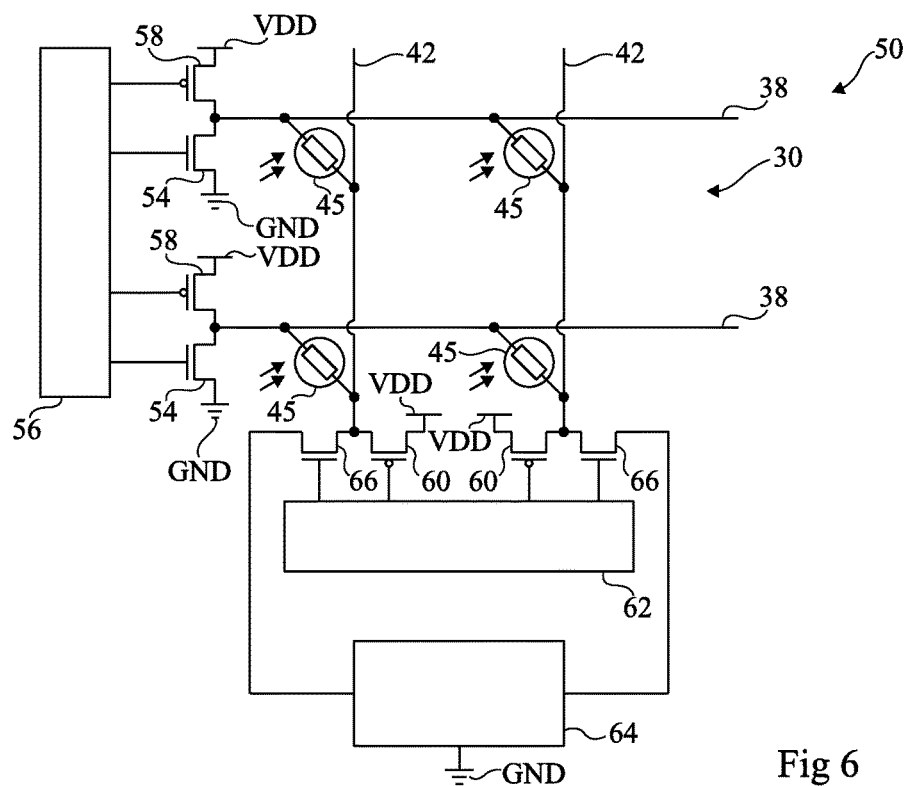
FIG. 6 is an electric diagram of an embodiment of a light detection system comprising the detection device shown in FIG. 2.

FIG. 6 shows an embodiment of a system 50 for detecting an electromagnetic radiation, particularly light, comprising detection device 30. Detection device 30 has been schematically shown as an array of photodetectors 45. As an example, four photoresistors distributed in two rows and two columns are shown. Each photoresistor 45 is connected to one of the conductive tracks 38 and to one of conductive tracks 42. In FIG. 6, two conductive tracks 38 in the row direction and two conductive tracks 42 in the column direction have been schematically shown.

Each conductive track 38 is connected to a source of a low reference potential, for example, ground GND, via a switch 54. Switches 54 are controlled by a row selection unit 56. As an example, each switch 54 corresponds to a metal-oxide gate field-effect transistor, or MOS transistor, for example, with an N channel, having its drain connected to conductive track 38, having its source connected to ground GND, and having its gate controlled by unit 56. Each conductive track 38 is connected to a source of a high reference potential VDD via a switch 58. Switches 58 are controlled by row selection unit 56. As an example, each switch 58 corresponds to a MOS transistor, for example, with a P channel, having its drain connected to conductive track 38, having its source connected to a potential source VDD, and having its gate controlled by unit 56.

Each conductive track 42 is connected to potential source VDD via a switch 60. Switches 60 are controlled by a column selection unit 62. As an example, each switch 60 corresponds to a MOS transistor, for example, with a P channel, having its drain connected to conductive track 42, having its source connected to potential source VDD, and having its gate controlled by unit 62. Each conductive track 42 is connected to ground GND by a switch 66. A current measurement circuit 64 is capable of measuring the current flowing through each conductive track 42 when the latter is connected to ground GND. Switches 66 are controlled by column selection unit 62. As an example, each switch 66 corresponds to a MOS transistor, for example, with an N channel, having its drain connected to conductive track 42, having its source connected to measurement circuit 64, and having its gate controlled by unit 62.

The operation of the embodiment of detection system 50 comprises selecting a photoresistor 45. This may be performed as follows:

for the row of the selected photoresistor 45, conductive track 38 is connected to potential source VDD by the turning-on of the associated switch 58, the associated switch 54 being maintained off;

for the other rows, conductive tracks 38 are set to ground GND by the turning-on of the associated switches 54, the associated switches 58 being maintained off;

for the column of the selected photoresistor 45, conductive track 42 is connected to measurement circuit 64 by the turning-on of the associated switch 66, the associated switch 60 being maintained off; and for the other columns, conductive tracks 42 are connected to potential source VDD by the turning-on of switches 60, switches 66 being maintained off.

For the selected photoresistor 45, a current flows through photoresistor 45 with an amplitude which varies according to the resistance of photoresistor 45 and thus according to the illumination received by photoresistor 45. For the other photoresistors 45 of the same row as the selected photoresistor 45, the two terminals of the photoresistors are connected to potential source VDD so that no current flows through photoresistors 45. For the other photoresistors of the same column as the selected photoresistor, the two terminals of the photoresistors are connected to ground GND so that no current flows through photoresistors 45. Measurement circuit 64 is capable of measuring the current flowing through the selected photoresistor 45. The resistance of the selected photoresistor 45 may be determined from the determination of the current flowing through photoresistor 45 and the knowing of the voltage across the selected photoresistor 45.

According to another embodiment, the light detection system may comprise the flowing of a constant current in the selected photoresistor and the measurement of a voltage representative of the voltage across the selected photoresistor. The measured voltage is a function of the resistance of the photoresistor and thus of the illumination received by the photoresistor.

Detection device 30 may be used as a user interface device capable of detecting variations of the shadow of an actuation member on the photoresistor array and/or variations of the reflected image, for example, in infrared, of the actuation member, and of deducing therefrom information representative of a position variation of the actuation member. The actuation member may be the user's finger, hand, or any other object.

It should be noted that position of the actuation member here means a position relative to the interface device. A usage mode where the user interface device itself is displaced, the actuation member remaining fixed, may in particular be provided.

According to an embodiment, the interface device is capable of detecting variations of the shadow of the actuating member on the photoresistor array when the actuation member is arranged between a light source and the array. The light source is preferably ambient light, for example, the sun, or the indoor electric lighting of a room in a building. According to an embodiment, the actuation member may be in contact with the interface device. According to an embodiment, the actuation member may be at a distance from the interface device and the user interface device may be capable of detecting displacements of the actuation member in a plane parallel to the plane of the photoresistor array, and variations of the distance between the actuation member and the photoresistor array.

Figure 7:
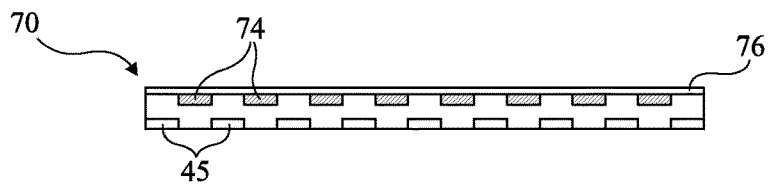
FIGS. 7 and 8 are cross-section views of other embodiments of the detection device.

FIG. 7 is a cross-section view showing another embodiment of a user interface device 70, comprising a photoresistor array 45, particularly such as those of previously-described detection device 47, associated with a display screen. This particularly enables to form an interactive interface. Device 70 comprises an array of light display (or backlighting) pixels 74. In this example, pixels 74, for example, light-emitting diodes, are arranged in a plane parallel to photoresistor array 45, and between the photoresistor array and a protection coating 76. Photoresistor array 45 and pixel array 74 are stacked with a slight offset so that, in top view, pixels 74 do not face photoresistors 45, which would mask photo-resistors 45 and would prevent the detection of the cast shadow of the actuation member.

In an alternative embodiment, photoresistor array 45 is placed between display pixel array 74 and protection coating 76. In this case, it may be provided to stack photoresistors 45 and pixels 76 with no offset, provided for photoresistors 45 to be made of transparent or translucent materials.

In another alternative embodiment, the detection and display arrays are not stacked, but are made in a same level of the stack of conductive and semiconductor arrays (alternation of pixels 74 and of photoresistors 45).

It should be noted that the display screen associated with interface device 70 is not necessarily a light-emitting diode display, but may also be formed with any other adapted technology.

Further, in another alternative embodiment, the display screen is not stacked to the user interface device, but is offset.

Figure 8:
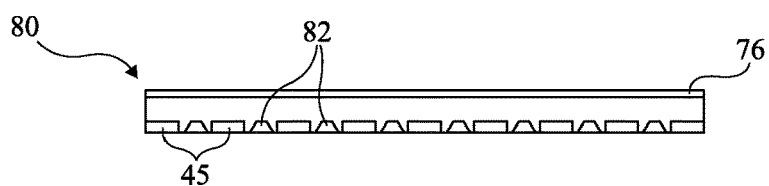

FIG. 8 is a cross-section view showing another alternative embodiment of an interface device 80 comprising, in addition to photoresistors 45, an infrared emitter array 82. Each photoresistor 45 then has its resistance depending on the received infrared radiation. In operation, each of emitters 82 permanently emits an infrared radiation. When the actuation member passes over an emitter 82, part of the emitted radiation is reflected towards a neighboring photoresistor, which enables to deduce therefrom information relative to the presence of an object above the interface. Thus, infrared detectors 82, in combination with photoresistors 45, enable device 80 to implement the same functions of detection of the position variations of the actuation member as photoresistors 45 alone used as shading detectors.

An advantage of infrared detection over shading detection is that its operation is independent from the ambient lighting and thus more robust. In particular, infrared detection may operate in the dark, in the absence of an external light source. It may be provided to alternate between a low-consumption operating mode, based on the detection of the cast shadow of the actuating member by photoresistors 45 when allowed by the ambient lighting, and an infrared operating mode when the lighting conditions do not allow the cast shadow detection. A darkness sensor may for example be provided to automatically switch from the low-consumption mode to the infrared mode when the ambient luminosity becomes too low to allow the cast shadow detection.

Figure 9:
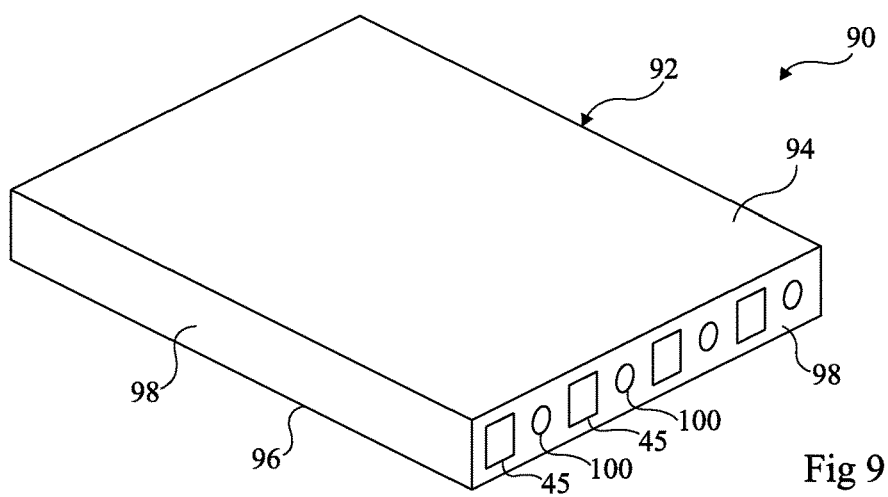
FIG. 9 is a partial simplified perspective view of another embodiment of the detection device.

FIG. 9 shows another embodiment of a detection device 90 where detection device 90 comprises a waveguide 92 comprising two opposite surfaces 94, 96 and edges 98. Along one of edges 98 of waveguide 92, detection device 90 comprises photoresistors 45, particularly such as those of previously-described detection device 47, and light emitters 100. As an example, in FIG. 9, a single row of photoresistors 45 is shown.

The light emitted by emitters 100 is guided in waveguide 92 by reflecting on surfaces 94, 96 and edges 98 and at least part of this light returns to photoresistors 45. When an object is laid on one of surfaces 94, 96 of waveguide 92, it disturbs the path of the light so that the light intensity received by the photoresistors decreases. Detection device 90 may be used to detect the presence or the absence of one or of a plurality of objects on one of surfaces 94, 96 or the dimensions of an object present on one of surfaces 94, 96.

According to an example of application, detection device 90 may be arranged in a shop or warehouse stall, the items being placed on one of surfaces 94 or 96 of waveguide 92. Detection device 90 may be used to detect the stall filling rate. Indeed, the light intensity received by photoresistors 45 depends on the number of items present on waveguide 92. Further, by calibration, it may be possible to distinguish the case where an item is not correctly placed on waveguide 92 but has fallen on waveguide 92.

According to another example of application, detection device 90 may form the bottom of a box, for example, a Petri dish, having microorganisms, bacteria, or cells of higher organisms grown therein, which along their growth form spots covering waveguide 92 and modifying the light intensity received by photoresistors 45. Detection device 90 then enables to measure the growth of the grown organisms.

The detection device comprising photoresistors according to the previously-described embodiments has a simpler structure than a detection device comprising photodiodes. Indeed, in the case of a photodetection device comprising an array of photodiodes made of organic materials, each photodiode comprises an active layer, a first interface layer interposed between the active layer and a first electrode, and a second interface layer interposed between the active layer and a second electrode. The first interface layer enables to align the work function of the first electrode with the electronic affinity of the acceptor material used in the active layer. The second interface layer enables to align the work function of the second electrode with the ionization potential of the donor material used in the active layer. According to the diode biasing mode, the interface layers ease the collection, the injection, or the blocking of charges from the electrodes in the active layer. Advantageously, the detection device comprising photoresistors according to the previously-described embodiments does not comprise such interface layers.

The invention claimed is:

1. An electromagnetic radiation detection device comprising: at least one row of photoresistors, each photoresistor comprising an active portion comprising organic semiconductor materials; emitters of the electromagnetic radiation; and a waveguide; wherein the waveguide comprises at least one surface intended to be in contact with at least one object, the photoresistors being distributed along an edge of said surface, the emitters being located along said edge.

2. The detection device of claim 1, comprising an array of photoresistors distributed in rows and in columns.

3. The detection device of claim 1, wherein each active portion is connected to a first conductive electrode and to a second conductive electrode.

4. The detection device of claim 3, wherein the work function of the first conductive electrodes is equal to the work function of the second conductive electrodes to within 5%.

5. The detection device of claim 1, comprising a monolithic layer containing the active portions and extending between first conductive tracks corresponding to the first electrodes and second conductive tracks corresponding to the second electrodes.

6. The detection device of claim 1, further comprising display pixels.

7. A detection system comprising the detection device of claim 1, a circuit for selecting one of the photoresistors and a circuit for measuring the current flowing through the selected photoresistor or a voltage representative of the voltage across the selected photoresistor.

8. A method of controlling the electromagnetic radiation detection device of claim 1, comprising selecting a photoresistor from said at least one row and determining a signal representative of the resistance of the photoresistor.

9. The control method of claim 8, wherein the detection device comprises an array of photoresistors distributed in rows and in columns, first conductive tracks and second conductive tracks, each first conductive track being connected to the photoresistors of a same row and each second conductive track being connected to the photoresistors of a same column, and wherein the selection step comprises the steps of:
connecting the first conducting track connected to the photoresistor to be selected to a source of a first potential;
connecting the other first conductive tracks to a source of a second potential different from the first potential;
connecting the second conductive track connected to the photoresistor to be selected to the source of the second potential; and
connecting the other second conductive tracks to the source of the first potential.

* * * * *